United States Patent
Joung et al.

(10) Patent No.: US 11,420,363 B2
(45) Date of Patent: Aug. 23, 2022

(54) VEHICULAR INTERIOR MATERIAL MANUFACTURING METHOD

(71) Applicant: LG HAUSYS, LTD., Seoul (KR)

(72) Inventors: Jae-Youl Joung, Daejeon (KR); Yeon-Wook Choi, Ulsan (KR); Yong-Gu Kwon, Seoul (KR); Dong-Hwan Choi, Gwangmyeong-si (KR)

(73) Assignee: LG HAUSYS, LTD., Seoul (KR)

( * ) Notice: Subject to any disclaimer, the term of this patent is extended or adjusted under 35 U.S.C. 154(b) by 613 days.

(21) Appl. No.: 16/336,768

(22) PCT Filed: Sep. 27, 2017

(86) PCT No.: PCT/KR2017/010754
§ 371 (c)(1),
(2) Date: Mar. 26, 2019

(87) PCT Pub. No.: WO2018/062870
PCT Pub. Date: Apr. 5, 2018

(65) Prior Publication Data
US 2021/0291415 A1    Sep. 23, 2021

(30) Foreign Application Priority Data
Sep. 27, 2016 (KR) .................. 10-2016-0124281

(51) Int. Cl.
*B29C 37/00* (2006.01)
*B41M 1/40* (2006.01)
(Continued)

(52) U.S. Cl.
CPC .......... *B29C 37/0025* (2013.01); *B41M 1/40* (2013.01); *B60R 13/02* (2013.01); *C09D 11/322* (2013.01);
(Continued)

(58) Field of Classification Search
CPC ..................... B29C 2045/0094; B41M 1/40
See application file for complete search history.

(56) References Cited

U.S. PATENT DOCUMENTS 6,954,967 B2 * 10/2005 Park ..................... B29C 45/16
                                                    16/412
8,893,617 B2 * 11/2014 Muraoka ................ B41M 1/02
                                                    101/490
(Continued)

FOREIGN PATENT DOCUMENTS

CN        101010203 A     8/2007
CN        101014466 A     8/2007
(Continued)

OTHER PUBLICATIONS

Chinese Office Action dated Nov. 3, 2020, in connection with the Chinese Patent Application No. 201780059342.2.
(Continued)

*Primary Examiner* — Benjamin A Schiffman
(74) *Attorney, Agent, or Firm* — Hauptman Ham, LLP

(57) ABSTRACT

Provided are a vehicular interior material manufacturing method and a vehicular interior material, the method comprising the steps of: forming a molded article including a surface having an uneven shape; and forming a printing layer on the surface of the molded article by using a predetermined blanket.

6 Claims, 2 Drawing Sheets

(51) Int. Cl.
  *B60R 13/02* (2006.01)
  *C09D 11/322* (2014.01)
  *B29C 43/36* (2006.01)
  *B29C 45/00* (2006.01)
  *C09D 11/101* (2014.01)
  *B41M 1/30* (2006.01)
  *B29C 59/02* (2006.01)

(52) U.S. Cl.
  CPC ............ *B29C 43/36* (2013.01); *B29C 59/022* (2013.01); *B29C 2037/0046* (2013.01); *B29C 2045/0079* (2013.01); *B29C 2795/007* (2013.01); *B29K 2995/0094* (2013.01); *B41M 1/30* (2013.01); *C09D 11/101* (2013.01)

(56) References Cited

U.S. PATENT DOCUMENTS

| | | | | |
|---|---|---|---|---|
| 8,893,619 | B2* | 11/2014 | Muraoka | B41F 5/22 |
| | | | | 101/492 |
| 9,487,673 | B2* | 11/2016 | Yun | C08L 83/04 |
| 9,670,355 | B2* | 6/2017 | Lee | C08J 7/046 |
| 10,137,661 | B2* | 11/2018 | Takihara | B29C 45/1418 |
| 10,137,669 | B2* | 11/2018 | Kim | B05D 1/40 |
| 11,007,694 | B2* | 5/2021 | An | B29C 45/372 |
| 2004/0094867 | A1 | 5/2004 | Gomez et al. | |
| 2008/0011177 | A1 | 1/2008 | Muraoka | |
| 2008/0305305 | A1* | 12/2008 | Sano | B29C 33/60 |
| | | | | 428/168 |
| 2011/0287220 | A1* | 11/2011 | Ban | B44C 1/24 |
| | | | | 428/141 |
| 2021/0062412 | A1* | 3/2021 | Jeon | D02J 1/08 |

FOREIGN PATENT DOCUMENTS

| | | |
|---|---|---|
| CN | 102378692 A | 3/2012 |
| CN | 102471625 A | 5/2012 |
| CN | 105102211 A | 11/2015 |
| JP | H02239972 A | 9/1990 |
| JP | 2007-112374 A | 5/2007 |
| JP | 2013-000938 A | 1/2013 |
| JP | 2013198996 A | 10/2013 |
| JP | 2016-147410 A | 8/2016 |
| KR | 10-2004-0041025 A | 5/2004 |
| KR | 10-2007-0041557 A | 4/2007 |
| KR | 10-0715090 B1 | 5/2007 |
| KR | 10-2015-0011839 A | 2/2015 |
| KR | 10-1528967 B1 | 6/2015 |

OTHER PUBLICATIONS

International Search Report dated Jan. 8, 2018, issued in corresponding International Patent Application No. PCT/KR2017/010754.

* cited by examiner ly intellect# VEHICULAR INTERIOR MATERIAL MANUFACTURING METHOD

CROSS-REFERENCE TO RELATED APPLICATIONS

This present application is a national stage filing under 35 U.S.C § 371 of PCT application number PCT/KR2017/010754 filed on Sep. 27, 2017 which is based upon and claims the benefit of priority to Korean Patent Application No. 10-2016-0124281 filed on Sep. 27, 2016 in the Korean Intellectual Property Office. The disclosures of the above-listed applications are hereby incorporated by reference herein in their entirety.

TECHNICAL FIELD

Disclosed herein is a method for manufacturing a vehicular interior material, and the vehicular interior material.

BACKGROUND

A molded article included in an interior material of a vehicle is considered as one of the important factors in design because the molded article included in the interior material of the vehicle may be visually confirmed and may be continuously physically contacted by a passenger or a user.

Generally, a liquid pressure transfer printing method, an IML method, and TOM, and the like, are used to express various kinds of aesthetics and textures of a molded article included in interior materials of the vehicle.

The liquid pressure transfer printing method is a method performed by floating a printing film on a surface of water and transferring the printing film onto the molded article. A method for manufacturing a film through an IML is a so-called insert molding labeling method and is a method performed by insert-injecting the printing film into a mold. The TOM is a so-called three-dimensional overlay method and means a method performed by pressure-molding the printing film by vacuum.

However, the above-mentioned methods have a problem with low precision in the printing and the printing of a curve being not easy, a complicated process for manufacturing the vehicular interior material, and expensive cost.

BRIEF SUMMARY OF THE DISCLOSURE

1. Technical Problem

In one implementation of the present disclosure, there is provided a method for manufacturing a vehicular interior material that enables ensuring excellent precision in printing, excellent texture, excellent workability, and excellent economic feasibility.

According to another implementation of the present disclosure, there is provided a vehicular interior material that enables ensuring excellent precision in printing, excellent texture, excellent workability, and excellent economic feasibility.

However, the technical problem to be solved by the present disclosure is not limited to the above-mentioned problems, and other problems, which are not mentioned, can be clearly understood by those skilled in the art from the following description.

2. Technical Solution

According to an implementation of the present disclosure, a method for manufacturing a vehicular interior material includes forming a molded article including a surface having a concavo-convex shape; and forming a printing layer on the surface of the molded article using a predetermined blanket.

Through the method for manufacturing the vehicular interior material, precision in printing may be effectively enhanced by forming a printing layer on a surface of the molded article through printing using a predetermined pad or blanket, and the like. In particular, when at least one of surfaces of the molded article includes a surface having a concavo-convex shape, it is possible to ensure excellent precision in printing, excellent texture, excellent workability, and excellent economic feasibility, to thereby embody a designed pattern with a high resolution and create various kind of indoor atmosphere that meets the needs of a customer.

In the method for manufacturing the vehicular interior material, the molded article may be formed such that the surface having the concavo-convex shape includes a concave portion and a convex portion, and a width of the convex portion is identical to or greater than that of the convex portion, and specifically, the molded article may be formed such that the width of the convex portion is greater than the concave portion.

There is a problem that the precision in printing is degraded because of limitations and constraints of fineness of dot when the printing layer is formed on the surface having the concavo-convex or an emboss, rather than a plane, using the predetermined blanket.

In the method for manufacturing the vehicular interior material, a shape of the molded article is controlled such that the width of the convex portion is equal to or greater than that of the concave portion, thereby effectively preventing the ink transferred to the convex portion from being transferred.

According to another implementation of the present disclosure, there is provided a vehicular interior material manufactured according to the method for manufacturing the vehicular interior material.

Through the molded article including the concavo-convex shape, excellent precision in printing, excellent texture, excellent workability, and excellent economical efficiency may be ensured, and various types of designs and an indoor atmosphere that meets the needs of customers may be formed.

3. Advantageous Effects

A method for manufacturing the vehicular interior material and the vehicular interior material may enable ensuring excellent precision in printing, excellent texture, excellent workability, and excellent economic feasibility.

DETAILED DESCRIPTION

Figure 1:
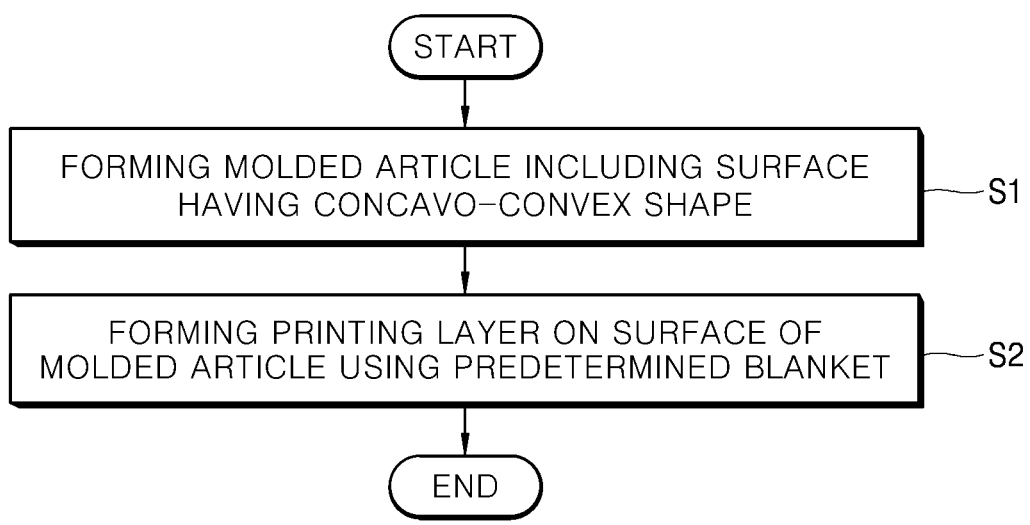
FIG. 1 is a schematic process flow diagram of a method for manufacturing a vehicular interior material according to an implementation of the present disclosure.

In the present specification, assuming that predetermined implementations and/or predetermined components included in the predetermined implementations "includes" a certain component, it may mean that it may further include other components and does not exclude other components unless otherwise particularly described to the contrary.

In this specification, the formation or positioning of any configuration at an upper portion (or a lower portion) of the base material or on (or under) the base material means that any configuration is formed or positioned in contact with the upper surface (or the lower surface) of the base material and is not limited to not including other configurations between the base material and any configuration formed on (or under) the base material.

As used herein, the terms "a step of (doing) ~" or "a step of ~" do not mean "a step for ~".

As used herein, the terms "about", "substantially", and the like may be used to mean 'at the numerical value' or 'close to the numerical value' when inherent manufacturing method and an allowable error of a material are provided in addition to the above-mentioned meaning, and may be used to prevent the disclosure in which the accurate or absolute numerical value is mentioned to help understanding of this application from being unreasonably used by unscrupulous infringers.

Hereinafter, exemplary implementations of the present disclosure will be described in detail with reference to the accompanying drawings so that those skilled in the art to which the present disclosure pertains can easily carry out the present disclosure. It should be understood, however, that the present disclosure may be implemented in many different manners and the implementations set forth herein are provided to merely illustrate or describe the present disclosure, and the present disclosure is not limited to the implementations set forth herein.

In order to clearly illustrate the preset disclosure, a part that is not related to the disclosure may be omitted from the accompanying drawings. The same or similar components are denoted by the same reference numerals throughout the specification. In the drawings, the thickness is enlarged to clearly express various types of layers and regions. In the drawings, for convenience of explanation, the thicknesses of some layers and regions are exaggerated.

FIG. 1 schematically shows a process flow diagram of a method for manufacturing a vehicular interior material according to an implementation of the present disclosure.

The method for manufacturing the vehicular interior material may include forming a molded article including a surface having a concavo-convex shape (S1); and forming a printing layer on the surface of the molded article using a predetermined blanket (S2).

Generally, a water pressure transfer printing method, an IML method, a TOM, and the like are used to express various kinds of aesthetics and textures of a molded article such as an interior material of a vehicle.

However, the above-mentioned methods have a problem with low precision in printing and printing of curve being not easy and the complicated process for manufacturing the vehicular interior material, and the expensive cost.

Therefore, according to an implementation of the present disclosure, through the method for manufacturing the vehicular interior material, the printing layer is formed on the surface of the molded article through printing using a predetermined pad or blanket, and the like to effectively enhance the precision in printing, and when at least one of the surfaces of the molded article includes the surface having the concavo-convex shape, the excellent precision in printing, the excellent texture, excellent workability, and excellent economic feasibility may be ensured to thereby embody a desired pattern with high resolution and create various kind of indoor atmosphere that meets the needs of the customer.

The kinds of the predetermined pad or blanket known in the prior documents may be suitably selected and used depending on the purpose and use of the present disclosure. For example, the pad or blanket, and the like is disclosed in the prior documents, for example, Korean Patent No. 10-0715090, 10-0854208, 10-1528967, and Korean Patent Laid-Open Publication No. 10-2015-0011839.

Figure 2:
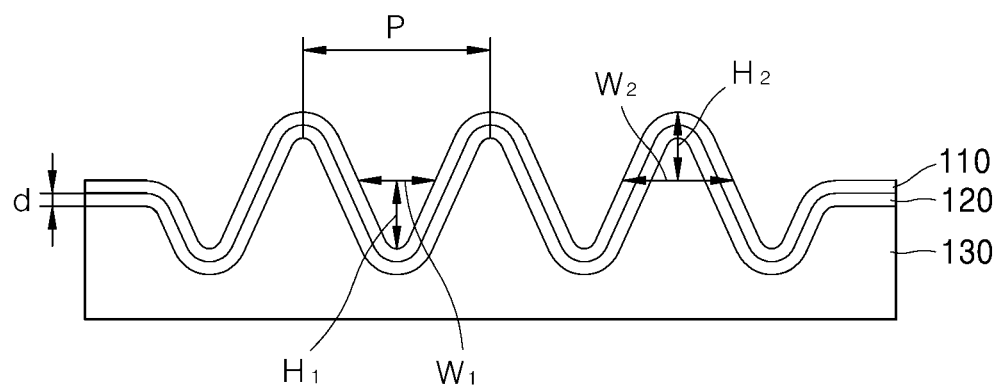
FIG. 2 is a schematic cross-sectional view of a vehicular interior material according to another implementation of the present disclosure.

As shown in FIG. 2, in the present specification, when the surface of the molded article does not have a concavo-convex shape, but have a planar shape, a width $W_2$ of a convex portion may refer to a maxim width between the portion convexly protruding from a surface having an imaginary planar shape, and a width $W_1$ of the concave portion may refer to a maximum width between the portion concavely recessed, and a height $H_2$ of the convex portion or a height $H_1$ of the concave portion may refer to a length of a perpendicular line to a point protruding convexly at most or a point concavely recessed from the surface having the imaginary planar shape.

In the method for manufacturing the vehicular interior material, the molded article may be formed such that the surface having the concavo-convex shape includes a concave portion and a convex portion, and the width of the convex portion is equal to or greater than that of the concave portion, and specifically, the width of the convex portion is greater than that of the concave portion.

There is a problem that the precision in printing is degraded because of limitations and constraints in fineness of dot when the printing layer is formed on the surface having the concavo-convex or an emboss, rather than the plane, using the predetermined blanket.

In the method for manufacturing the vehicular interior material, the shape of the molded article is controlled such that the width of the convex portion is equal to or greater than that of the concave portion to thereby effectively prevent the ink transferred to the convex portion from being spread.

Specifically, when the width of the convex portion is less than that of the concave portion, the transferred ink may be partially spread to thereby degrade the precision in printing.

The molded article may be formed such that the width of the concave portion is about 0.01 mm to about 50 mm.

The molded article may be formed such that the width of the convex portion is about 0.01 mm to about 200 mm.

Further, the molded article may be formed such that the depth of the concave portion is about 0.01 mm to about 20 mm. Further, the molded article may be formed such that the height of the convex portion is about 0.01 mm to about 20 mm.

By forming the concave portion or the convex portion at the depth or the height within the above range, printing may be performed more precisely using the blanket, and a sufficient three-dimensional effect may be provided to improve a degree of freedom of design. The molded article may be formed such that the average pitch P of the concavo-convex shape is about 0.01 mm to about 200 mm. As shown in FIG. 2, the pitch may be used as a reference of an interval of the concave portions or an interval of the convex portions. Further, for example, the pitch may refer to a distance between the peaks and a distance between the troughs.

Further, when the surface of the molded article includes a plurality of surfaces having the concavo-convex shape, the surfaces having the concavo-convex shapes may have the same or different average pitches.

For example, a part of the surfaces of the concavo-convex shapes may have a narrow average pitch from about 0.01 mm to about 0.1 mm, and another part of the surfaces of the concavo-convex shapes may have a wide average pitch from about 100 mm to about 200 mm, but is not limited thereto.

A ratio of the surface having the concavo-convex shape to the total area of the surface of the molded article may be, for example, from about 20% to about 100%, and may also be, for example, from about 30% to about 60%.

The concavo-convex shape may refer to, for example, a concavo-convex pattern or an emboss pattern, and includes the concave and convex portions as described above.

Further, the concavo-convex shape may include at least one selected from the group consisting of, for example, a triangular pattern, a quadrangle pattern, a pentagonal pattern, a hexagonal pattern, a curved pattern, and a combination thereof, and may include a suitable combination of the triangular pattern, the quadrangle pattern, the pentagonal pattern, the hexagonal pattern, and the curved pattern to embody a desired design, but is not limited thereto.

In the step of forming the molded article, at least two selected from the group consisting of a thermosetting resin, a thermoplastic resin, a filler, and other additives such as a dimensional stabilizer, and the like are mixed to prepare a resin composition, and the prepared resin composition may be injection molded to form the molded article.

For example, the molded article may be formed by injecting the resin composition to the injection mold in which a concavo-convex shape corresponding to the concavo-convex shape is engraved or etched to the inner surface thereof and injection molding the resin composition. The kinds of the injection mold known in the art may be used, for example, the injection mold may be formed of metal or a plastic material, but is not limited thereto.

The process conditions during injection molding may vary depending on the kind of the resin to be used, and the injection molding may be performed within a temperature range of, for example, about 120° C. to about 350° C., but the process conditions during injection molding are not limited a temperature range of, for example, about 120° C. to about 350° C. Further, a pressure of the process conditions may be appropriately adjusted depending on a specific shape or thickness of the injection molded article.

For example, the thermoplastic resin may include at least one selected from the group consisting of polyvinyl chloride (PVC) resin, polystyrene, polyethylene, polypropylene, acrylonitrile butadiene styrene, polycarbonate, polyamide, acrylic, nylon, vinyl acetate thermoplastic polyolefin resin (TPO), thermoplastic polyurethane (TPU) resin, and a combination thereof.

The examples of the thermosetting resin may include, for example, phenol, epoxy, polyester, polyurethane, melamine, urea resin, and the like, and may include at least one selected from the group consisting of a combination thereof.

The thermoplastic resin and the thermosetting resin may be mixed such that the total of the thermoplastic resin and the thermosetting resin in the composition accounts for, for example, about 10% by weight to about 99% by weight.

The organic solvent may include at least one selected from the group consisting of toluene, xylene, dibutyl ether, isopropyl ether, dioxane, tetrahydrofuran, acetone, diethyl ketone, methyl ethyl ketone, methyl isobutyl ketone, methyl propyl ketone, cyclohexanone, and a combination thereof, but is not limited thereto.

The other additives may include at least one selected from the group consisting of a flame retardant, a water repellent, an antistatic agent, an agent for blocking ultraviolet rays, and a combination thereof.

In the method for manufacturing the vehicular interior material, a printing layer may be formed on the surface of the molded article using a predetermined blanket. The blanket may be referred to as a so-called "pad".

The blanket and the method for manufacturing the blanket disclosed in the known prior documents may be applied to the blanket and the method for manufacturing the blanket according to the present disclosure.

The blanket may be made of, for example, a silicone rubber material, but is not limited thereto.

Further, the surface of the blanket may have a surface roughness of from about 0.5 μm to about 2.0 μm, but is not limited thereto.

Further, the portion of the blanket in contact with the printing plate may have a semicircular shape, a circular shape or a pyramidal shape, but the portion of the blanket in contact with the printing plate is not limited to thereto.

In the step of forming the printing layer, the ink is applied onto a predetermined printing plate, and the ink is transferred to the blanket while the blanket is pressed on and taken off from the printing plate to which the ink is applied, and the ink is transferred to the surface having the concavo-convex shape while the blanket to which the ink is transferred is pressed on or taken off from the surface having the concavo-convex shape to perform the printing.

The printing plate may be formed of a material known in the art and may be formed of, for example, materials such as plastic, metal, wood, and the like, but is not limited the thereto.

In the method for manufacturing the vehicular interior material, the ink is prepared by mixing at least two selected from the group consisting of a photo-curable resin, a pigment, an additive, a solvent colorant, a photoinitiator, a tackifier, a coupling agent, a surfactant, and a combination thereof, and the link may be applied onto the printing plate.

The kinds of the ink known in the art may be used.

The photo-curable resin may include, for example, a (meth) acrylic resin.

The colorant may suitably include colorants having various kinds of colors known in the art depending on the purpose and use of the disclosure, for example, and may include, for example, titanium dioxide colorants, zinc oxide colorants, graphite colorants, iron oxide colorants, anthraquinone colorants, cobalt oxide colorants, and the like, but is not limited to thereto.

Further, in the step of forming the printing layer, both surfaces of the printing layer may be formed to include the concavo-convex shapes corresponding to the concavo-convex shapes included in the surface of the molded article, and one surface of the molded article contacts one surface of the printing layer, and one surface of the molded article and one surface of the printing layer include the concavo-convex shapes opposed to each other so that one surface of the molded article is closely attached to and corresponds to one surface of the printing layer to thereby effectively enhance the precision in printing.

As shown in FIG. 2, the surface including the concavo-convex shape of the printing layer and the surface including the concavo-convex shape of the molded article are in contact with each other, and the convex portion is formed on the surface of the molded article in contact with a portion in which the concavo is formed, in the surfaces of the ink layer, and the concave portion may be formed in the surface of the molded article in contact with the portion in which the convex portion is formed, in the surfaces of the ink layer.

According to an implementation, the molded article may be formed to exhibit a color different from that of the printing layer, and the printing layer may be formed on a part of the surface of the molded article, while the printing layer may not be formed on the other parts of the surface of the molded article.

For example, the printing layer may only be formed on any one of the convex portion or the concave portion the surface of the concavo-convex shape of the molded article includes so that the convex portion and the concave portion may exhibit different colors from each other. Thus, a colorful decoration effect may be implemented using ink having a few type of color without forming the printing layer throughout the surface having the concavo-convex shape.

The method for manufacturing the vehicular interior material may further include performing a glossy coating, a matte coating, or both of them on the molded article having the printing layer formed thereon, thereby sufficiently protecting the surface of the molded article on which the ink layer is formed, and providing various kinds of design.

The glossy coating or the matte coating may be performed by coating a coating composition including at least one selected from the group consisting of, for example, a binder resin, a glossy agent or a matting agent, a flame retardant, a water repellent, an antistatic agent, and a combination thereof.

Examples of the binder resin include a (meth) acrylic resin, an epoxy resin, a urethane resin, a polyester resin, and a fluorine resin.

Further, as described above, in the glossy coating or the matter coating, when the printing layer contacts the molded article, one surface of the coating layer and one surface of the printing layer may be coated such that one surface of the coating layer is closely attached to and corresponds to one surface of the printing layer, and accordingly, the concavo-convex shape at least a part of the interior material of the vehicle includes is maintained without being disappearing to thereby express various kinds of textures.

The glossy coating or the matte coating may be performed using, for example, a method of gravure coating, a slot die coating method, a spin coating method, a spray coating method, a bar-coating method, and a deposited coating method but the glossy coating or the matte coating are not limited the above-mentioned methods.

In another implementation of the present disclosure, there is provided the vehicular interior material manufactured according to the method for manufacturing the vehicular interior material. FIG. 2 is a schematic cross sectional view of a molded article including the concavo-convex shape.

There is an advantage that, through the molded article including the concavo-convex shape, excellent precision in printing, excellent texture, excellent workability, and excellent economic feasibility may be ensured, and a desired image may be implemented with a high resolution, and a texture may be effectively expressed to thereby create various types of design, and indoor atmosphere that meets the needs of the customer.

The examples of the vehicular interior material may include a center fascia, a door trim, a garnish, a console box, an armrest, or a steering wheel, but the vehicular interior material is not limited the above-described matter.

Hereinafter, specific implementations of the present disclosure will be described. However, the implementations described below are only intended to illustrate or describe the present disclosure, and the present disclosure should not be limited thereto.

EMBODIMENT

Embodiment 1

A thermosetting resin, PC and an ABS resin was used to prepare a molding composition, and then, the resin composition was injected into an injection mold made of a metal and injection molded under the condition of a temperature of about 230° C. to about 260° C. and a pressure of about 100 $kgf/cm^2$ to about 150 $kgf/cm^2$ to form a molded article.

About 60% of the entire surface of the molded article included a concavo-convex shape, and the concavo-convex shape included a convex portion and a concavo portion. When a width of the convex portion is considered to be greater than that of the concave portion, the width of the concave portion was formed in a range of about 5 mm to about 20 mm, and a depth of the concave portion was formed in a range of about 0.1 mm to about 5 mm, and the width of the convex portion was formed in a range of about 5.0 mm to about 20 mm, and a height of the convex portion was formed in a range of about 0.1 mm to about 10 mm, and a pitch of the convex portion and the concave portion was formed in a range of about 0.1 mm to about 10 mm.

The printing is directly performed on the surface of the molded article having the concavo-convex portion using a blanket (manufactured by Shuho Co., Ltd. of Japan) to form a printing layer having a thickness of 0.1 to 20 μm. Then, a coating layer having a thickness of 0.5 to 20 μm was formed by performing the matter coating on the surface of the molded article on which the printing layer is formed to manufacture the interior material of the vehicle.

Comparative Example 1 (in a Case in which a Width of a Convex Portion is Less than that of a Concave Portion and Precision in Printing is Low)

An interior material of au automobile was manufactured under the same conditions and in the same manner as in Example 1, except that a concavo-convex portion of the molded article was formed such that a width of the convex portion was less than that of the concave portion.

Experimental Example

A printed surface of the vehicular interior material according to Example 1 and Comparative Example 1 was evaluated and is shown in Table 1 below.

Evaluation Method

Evaluation of Appearance

Measurement method: An appearance of the printing layer is observed with a loupe (Peak, 816). The case in which precision in printing is relatively high, for example, in which the ink is stably transferred to an original position thereof clearly without being spread is evaluated as excellent and expressed as "O". The case in which the precision in printing is relatively low, for example, in which the ink is spread or is not properly transferred is evaluated as inferior, and expressed as "X".

TABLE 1

| | Evaluation of printing layer |
|---|---|
| Example 1 | ○ |
| Comparative Example 1 | X |

As shown in Table 1, in the printing layer formed on the molded article including the concavo-convex shape according to Example 1, the ink is not spread and is stably transferred during printing so that the precision in printing is excellent and the desired image may be implemented with high resolution, and the texture of the printing layer may be effectively expressed. The excellent precision in printing, the excellent workability, and the excellent economic feasibility were ensured in comparison to using a water pressure transfer printing method, an IML method, and a TOM.

On the other hand, the ink was spread on or was not properly transferred to the printing layer of the molded article including the concavo-convex shape according to Comparative Example 1 to have a low resolution in image and form artificial atmosphere.

INDUSTRIAL APPLICABILITY

A method for manufacturing a vehicular interior material and the vehicular interior material enables ensuring excellent precision in printing, excellent texture, excellent workability, and excellent economic feasibility.

The invention claimed is:

1. A method for manufacturing a vehicular interior material, comprising:
    forming a molded article comprising a surface having a concavo-convex shape;
    forming a printing layer on the surface of the molded article using a predetermined blanket; and
    performing a glossy coating, a matte coating, or both of them on the molded article on which the printing layer is formed,
    wherein the molded article is formed such that the surface having the concavo-convex shape comprises a concave portion and a convex portion, and a width of the convex portion is greater than a width of the concave portion,
    wherein the molded article is formed such that the width of the concave portion is 5 mm to 20 mm, and the width of the convex portion is 5 mm to 20 mm, and
    wherein the molded article is formed such that a depth of the concave portion is 0.1 mm to 5 mm, a height of the convex portion is 0.1 mm to 10 mm, and an average pitch of the concavo-convex shape is 0.1 mm to 10 mm.

2. The method for manufacturing the vehicular interior material of claim 1, wherein a ratio of a surface having the concavo-convex shape to the total area of the surface of the molding is 20% to 100%.

3. The method for manufacturing the vehicular interior material of claim 1, in a step of forming the molded article, preparing a resin composition by mixing at least two selected from the group consisting of a thermoplastic resin, a thermosetting resin, a solvent, an inorganic filler, other additives, and a combination thereof, and injection molding the prepared resin composition to form the molded article.

4. The method for manufacturing the vehicular interior material of claim 1, in a step of forming the printing layer, applying an ink onto a predetermined printing plate, and transferring the ink onto the blanket while pressing and taking off from the blanket onto the printing plate to which the ink is applied, and transferring the ink onto the surface having the concave-convex shape while the blanket to which the ink is transferred is pressed on and taken off from the surface having the concavo-convex shape to perform printing.

5. The method for manufacturing the vehicular interior material of claim 4, preparing the ink by mixing at least two selected from the group consisting of a photo-curable resin, a pigment, an additive, a solvent colorant, a photoinitiator, a tackifier, a coupling agent, a surfactant, and a combination thereof and applying the ink onto the printing plate.

6. The method for manufacturing the vehicular interior material of claim 1, wherein, in the step of forming the printing layer, both surfaces of the printing layer are formed to include a concavo-convex shape corresponding to the concavo-convex shape included in the surface of the molded article so that, when the molded article contacts the printing layer, the surface of the molded article and the surface of the printing layer comprise a concavo-convex shape opposed from each other, and the surface of the molded article is closely attached to and corresponds to the surface of the printing layer.

\* \* \* \* \*